United States Patent [19]
Sannino et al.

[11] Patent Number: 6,043,764
[45] Date of Patent: Mar. 28, 2000

[54] SYSTEM FOR DECODING THE EFM AND EFM-PLUS FORMAT IN OPTICAL DISC (CD AND DVD) READ UNITS AND CORRESPONDING METHOD OF DECODING

[75] Inventors: Roberto Sannino, Romano Lombardo; Filippo Brenna, Villa Raverio, both of Italy

[73] Assignee: SGS Thomson Microelectronics, S.r.l., Agrate Brianza, Italy

[21] Appl. No.: 09/008,370

[22] Filed: Jan. 16, 1998

[51] Int. Cl.[7] .............................. H03M 5/00; H03M 7/00
[52] U.S. Cl. ................................. 341/59; 341/58
[58] Field of Search .................... 341/59, 58; 327/159; 369/48; 386/95, 111; 380/49

[56] References Cited

U.S. PATENT DOCUMENTS

| | | | |
|---|---|---|---|
| 5,661,425 | 8/1997 | Minoda et al. | 327/159 |
| 5,748,119 | 5/1998 | Ko | 341/59 |

FOREIGN PATENT DOCUMENTS

| | | |
|---|---|---|
| 0 405 836 | 1/1991 | European Pat. Off. . |
| 0 625 828 | 11/1994 | European Pat. Off. . |
| 0 718 843 | 6/1996 | European Pat. Off. . |

OTHER PUBLICATIONS

Ko et al, "A New Highly Efficient EFM Compatible Modulation Code for Optical Disc Storage," IEEE, 208–209, Mar. 1996.

*Primary Examiner*—Michael Tokar
*Assistant Examiner*—Patrick Wamsley
*Attorney, Agent, or Firm*—Jenkens & Gilchrist, P.C.

[57] ABSTRACT

System for decoding code words in the EFM-PLUS and/or EFM format in which an enumeration block makes it possible to associate in a one-to-one manner with each of the code words a numerical value from a practically continuous set of numerical values. The numerical value, possibly summed with an offset value, by an address generator, addresses a read-only memory in which are stored information codes, each of which is associated, as decoded information, with one of the code words.

12 Claims, 4 Drawing Sheets

| I | 1 | 2 | 3 | 4 |
|---|---|---|---|---|
| 1 | 138 | 96 | 96 | 22 |
| 2 | 145 | 90 | 90 | 27 |
| 3 | 132 | 102 | 102 | 15 |
| 4 | 164 | 113 | 113 | 25 |

J

| J \ K | 0 | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|---|
| 6 | 0 | 0 | 0 | 0 | 0 | 0 | 0 | 0 | 0 | 0 | 0 | 0 | 0 | 0 | 0 | 0 | 1 |
| 5 | 0 | 0 | 0 | 0 | 0 | 0 | 0 | 0 | 0 | 0 | 0 | 0 | 0 | 1 | 6 | 21 | 56 |
| 4 | 0 | 0 | 0 | 0 | 0 | 0 | 0 | 0 | 0 | 0 | 1 | 5 | 15 | 35 | 70 | 126 | 210 |
| 3 | 0 | 0 | 0 | 0 | 0 | 0 | 0 | 1 | 4 | 10 | 20 | 35 | 56 | 84 | 120 | 165 | 220 |
| 2 | 0 | 0 | 0 | 1 | 3 | 6 | 10 | 15 | 21 | 28 | 36 | 45 | 55 | 66 | 78 | 91 |
| 1 | 0 | 1 | 2 | 3 | 4 | 5 | 6 | 7 | 8 | 9 | 10 | 11 | 12 | 13 | 14 | 15 | 16 |
| 0 | 0 | 1 | 1 | 1 | 1 | 1 | 1 | 1 | 1 | 1 | 1 | 1 | 1 | 1 | 1 | 1 | 1 |

TAB (J,K)

*FIG. 4*

SYSTEM FOR DECODING THE EFM AND EFM-PLUS FORMAT IN OPTICAL DISC (CD AND DVD) READ UNITS AND CORRESPONDING METHOD OF DECODING

FIELD OF THE INVENTION

The present invention relates to a system for decoding code words generated in optical disc readers, whether for Compact Disc (CD) or for Digital Video Disc (DVD).

BACKGROUND OF THE INVENTION

In such discs the recording of the information is carried out using the well known technique of signal modulation known as NRZI (non-return to zero, in which a bit at logic 1 level is associated and represented by a signal transition and a 0 bit is associated with an absence of transition) and particular code formats, belonging to the family of DC-free codes and having limited non-zero runlength.

"Runlength" RL is understood to mean the distance, expressed as a number of binary symbols or bits, between bits associated with a signal transition. In the case of the NRZI technique it is therefore understood to mean the number of binary symbols which have the same logic 0 value and are placed consecutively in a sequence and which separate individual 1 bits.

The 1 bits are necessarily separated from one another since, otherwise, we would have RL=0.

The runlength limitation is represented by the expression RLL(d,k) where d and k respectively represent the minimum and maximum number of symbol units having logic 0 value.

For the coding formats used in optical discs, d is equal to 2 and k equal to 10.

Even if the runlength is limited to the same extent (RLL(2,10)), the format used in compact discs CDs known by the acronym EFM is substantially different from the EFM-PLUS format used in digital video discs DVDs.

With the EFM format an 8-bit binary information item (byte) is converted into a 14-bit code word to which are appended 3 "MERGING" bits in order to ensure compliance with the runlength limitation even when concatenating code words, whatever the following code word is, and also to limit the DC component of the signal resulting from the reading of the code word and of the associated merging bits.

With the EFM-PLUS format a byte is converted into a 16-bit code word.

To ensure compliance with the runlength limitation when concatenating the code words, the coding has to take into account what the following code word will be.

The code words associated with a particular byte configuration are therefore in general different in both cases.

Furthermore, whereas in the case of the EFM format the various byte configurations are each associated in a one-to-one manner with a particular code word, in the case of the EFM-PLUS format the correspondence is not one-to-one and in general a plurality of code words (synonyms) may be associated with each byte configuration, and the same code word may be associated, depending on the concatenation, with different byte configurations, i.e. on the original information, giving rise to ambiguity.

In either case, not all the code word configurations which may be represented respectively by from 14 to 16 bits ($2^{14}$ and $2^{16}$ of them respectively) are used, but only those which comply with the runlength limitation.

This has weighty consequences in the decoding phase.

This can occur only via extremely complex logic arrays, via associative memories for transcoding with a high number of cells, or via random access read-only memories (ROM) with considerable capacity respectively of $2^{14}$ addresses and at least $2^{17}$ addresses respectively.

Indeed, in the case of the EFM-PLUS format it is necessary to resolve possible ambiguities (aliasing) with the use of additional information (at least one bit) derived from analyses of the code word immediately following that which is to be decoded.

Therefore, the decoding function, in order to be carried out, requires a considerable number of logic elements, difficult to integrate into a single integrated circuit, on which they thus occupy appreciable space.

Finally, the functions for decoding the two formats have to be carried out by completely separate logic circuits, this increasing the complexity thereof and the congestion within an integrated circuit and consequently the cost.

SUMMARY OF THE INVENTION

The present invention solves this problem and provides a decoding system and corresponding method, which makes it possible to simplify the necessary logic circuits and minimize the number of memory cells necessary for decoding.

These results are achieved through the use of enumeration logic which by operating according to a predetermined algorithm, allows each code word, be it 14-bit or 16-bit, to be associated one-to-one with a predetermined binary number from a set of consecutive binary numbers.

With this number, with which is summed a displacement value or offset, (one of three values) depending on the format to be decoded (EFM or EFM-PLUS) and, in the case of the EFM-PLUS format also on the code word immediately following that to be decoded, it is possible to address a transcoding table, which is structured as a straightforward ROM memory with a restricted number of consecutively addressable memory or "entry" locations, and is divided into areas having different dimensions equal to those strictly necessary for the decoding of the various code words.

The present invention provides a system for decoding code words which each comply with a minimum runlength condition and each represent a binary information code associated with said code word. The system comprises means of enumeration for associating in a one-to-one manner with each of the code words to be decoded a numerical value from a substantially continuous set of numerical values, and a read-only memory in which is stored, at each location addressable with one of the numerical values from said set, a binary information code associated with the code word in turn associated with the numerical value for addressing said location.

The present invention also provides a method of decoding code words which each comply with a minimum runlength condition and each represent a binary information code associated with each code word. The method comprises the steps of associating in a one-to-one manner with a code word to be decoded a numerical value from a continuous set of numerical values, and addressing with said numerical value a read-only memory in which is stored, at each addressable location, a binary information code associated with the code word in turn associated with said numerical value.

BRIEF DESCRIPTION OF THE DRAWINGS

The characteristics and advantages of the invention will become clearer from the description which follows of a preferred embodiment, given with reference to the appended drawings in which:

FIG. 4 is a table, used in the system of FIG. 3, which represents, for each code word length, expressed as a number K of bits, the number of distinct code words which satisfy a predetermined minimum runlength condition RLL=2 and which contain a number J of 1 bits.

DETAILED DESCRIPTION OF A PREFERRED EMBODIMENT OF THE INVENTION

Figures 1, 2:
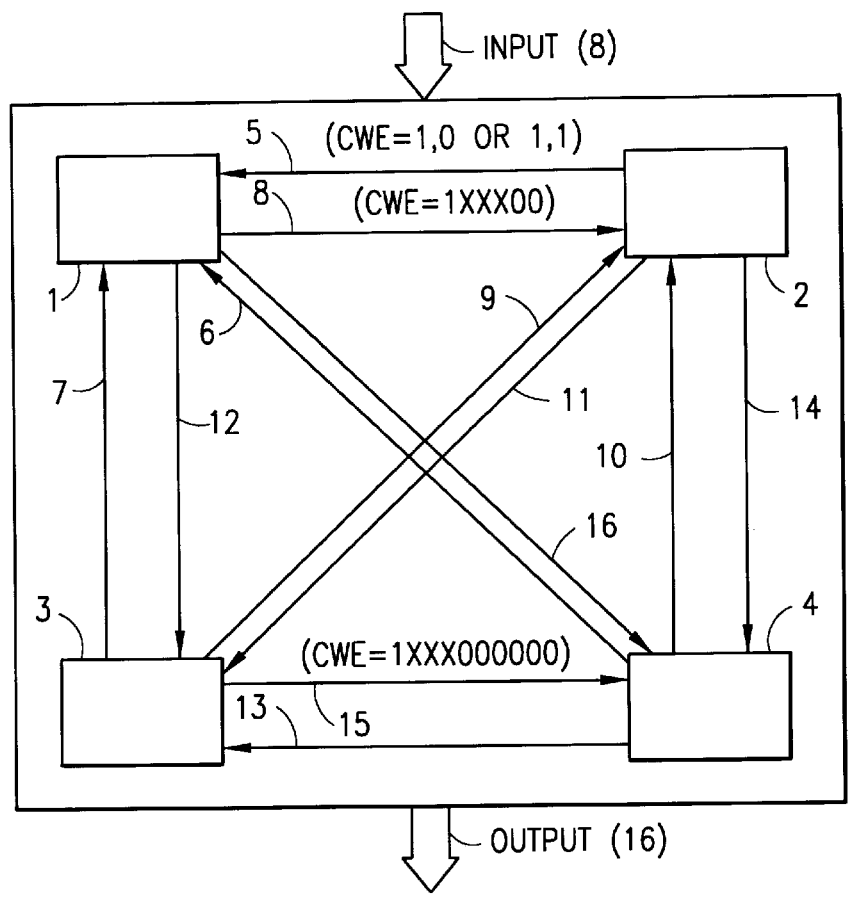
FIG. 1 is a block state chart of a finite-state logic machine, known in the art, for coding an information byte in the EFM-PLUS format.
FIG. 2 is a table for reckoning the number of code words which drive the state machine of FIG. 1 from one of the possible states I to another (or even the same) of the possible states J.

For a better understanding of the invention and its place within the state of the art, a lengthy preamble is required which for convenience is divided into sections.

Binary Code Conversion

The primary objective of the converting of a binary code of for example 8 bits into a different code word, with a larger number of bits, for its recording and subsequent reading, consists in transforming the frequency spectrum of serial data in such a way as to allow DC uncoupling and fast recovery of the clock signal, in the phase of reading the recording made which, in order to reduce the maximum frequency of the reading signal, is executed with the NRZI modulation technique.

It is clear that if an 8-bit binary code, which may have any of $2^8=256$ configurations, is recorded without format conversion and its bits are read in succession, at a frequency $f_{CLK}$, with the NRZI technique the reading signal can have a frequency equal to $f_{CLK}$ if the byte configuration is entirely is and zero frequency, with a 1 or 0 DC component which depends on the configuration of the previously read byte, if the byte configuration is entirely 0s.

Thus, with each 1 there is associated a signal transition and with each 0 no transition is associated.

Since the signal transitions are used by phase-locked loop circuits for the generation of the clock signal which allows recognition of the bit, from which the signal arose, it is in fact necessary for the frequency of the transitions not to be less than a predetermined minimum, so as to ensure the synchronization of the clock signal with the signal for reading the recording.

It is then expedient for the frequency of the transitions not to be greater than a predetermined maximum as this allows the reading speed to be all the higher the lower the frequency of the transitions.

Finally, it is appropriate for the low-frequency DC component in the signal to be as small as possible, since this aids discrimination of the transitions.

For these reasons an 8-bit binary code, in optical discs, is converted into and recorded as a 14- or 16-bit code word, while complying with the runlength limitation criteria already mentioned.

EFM CODING.

EFM modulation translates 8-bit binary sequences into 14-bit code words complying with the runlength parameters d=2 and k=10.

Such modulation provides furthermore for the insertion between each pair of code words of three additional bits whose value is calculated in such a way as to satisfy the following requirements:

1. To guarantee compliance with the runlength conditions even in the concatenation of successive code words.
2. To obtain effective suppression of the low-frequency content of the signal.

To satisfy condition (1) two bits only are theoretically necessary. The appending of a third bit, although on the one hand implying a reduction (around 6%) in the density of information obtainable on a disc, on the other hand allows the control, by the coder, of the DSV (digital sum value) index for measuring the low-frequency content of the analogue signal read by the laser.

In practice the coder, exploiting the degrees of freedom allowed by complying with condition (1), appends a transition of suitable polarity in the merging bits in such a way as to oppose the current course of the DSV, thereby obtaining an averaging of the latter and hence of the low-frequency content of the signal.

The byte is thereby transformed into a 17-bit CHANNEL FORMAT.

Overall the EFM code has an 8:17 efficiency, i.e. around 47%.

EFM DECODING.

The decoding of a signal consists simply in eliminating the merging bits from the channel word and associating the 8-bit binary code or symbol with the code word thereby obtained.

Only 256 of the $2^{14}$ code words representable with a 14-bit code are used and symbol association, in order to minimize the necessary resources, is executed, preferably, by means of an associative memory or "LOOK-UP TABLE" which can be structured in various ways.

EFM-PLUS Coding.

An extension to the Compact Disc family is represented by the Digital Video Disc (DVD), a novel means of optical recording endowed with a very high data storage capacity by virtue of the use of sophisticated optics, of lasers with shorter wavelength and of larger numerical aperture, factors which make it possible to reduce (with a reduction factor of around 1.5) the "spot-size" of the laser.

The increase in capacity is also promoted to some extent (6%) by the use of the EFM-PLUS format, which rather than converting a byte into a 17-bit channel format, converts it into a code word of 16 bits only, taking account however, so as to comply with the runlength limitation in the concatenation of the various words, of the immediately preceding code word.

An EFM-PLUS coder in its function can be represented, as illustrated in the state chart of FIG. 1, by a sequential finite-state machine furnished with an 8-bit input (INPUT) and a 16-bit output (OUTPUT) (code word) and by 4 states, 1, 2, 3, 4.

The 16-bit code word output by the state machine is dependent on the machine state and on the 8-bit input code and drives the machine into or causes it to enter another state.

Thus, each state is characterized by the type of words which cause the state to be entered (those generated in the preceding state) and cause the state to be exited (those generated by the current state from which it exits) in the following way.

1) The words which cause state 1 to be entered terminate with at most one 0 (i.e. with a 1 or with a 0 immediately preceded by 1).

This condition is represented by the transition lines 5, 6, 7 (CWE=10 OR 11).

2) The words which cause state 2 and 3 to be entered terminate with a number of zeros ranging from a minimum of two to a maximum of 5.

This condition is represented by the transition lines 8, 9, 10, 11, 12, 13 (CWE=1XXX00).

Obviously entry into one or other of the two states 2 and 3 is determined by the logic level of bits of the code word, other than the last 6 bits, which are of no interest here.

3) The words which cause state 4 to be entered terminate with a number of zeros ranging from a minimum of 6 to a maximum of 9.

This condition is represented by the transition lines 14, 15, 16 (CWE=1XXX000000).

These words should obviously be chosen in such a way that the concatenation of words entering and exiting a state, should satisfy the runlength requirements (d=2, k=10).

Consequently, the following requirements also obtain:

1) The words generated or which exit state 1 begin with a number of zeros ranging from a minimum of 2 to a maximum of 9.

2) The words which exit state 2 and 3 begin with a number of zeros at most equal to 5.

3) The words which exit state 4 begin with at most one zero.

The words which exit states 2 and 3, formally identical on account of the properties set forth, are distinguished through the fact of having their FIRST and THIRTEENTH bits both at zero, for those which exit state 2 and not both at zero for those which exit state 3.

On the basis of these properties, which characterize the words which enter and exit the various states it is possible to count the number of words which from any state drive the state machine into the other states or cause it to retain the same state.

The table of FIG. 2 represents the number of words which from a machine state I (1, 2, 3, 4) drive the machine into a next state J (1, 2, 3, 4) or cause it to retain the same state.

It is then noted that the minimum FAN-OUT (number of words exiting a state) is 351 words (those exiting state 3) and the maximum is 415 words (those exiting state 4).

It is also noted that the total number of words exiting the various states is equal to 1470.

There are therefore 351 or more possible output words for each state.

From the set of such code words 256 are extracted and collected into a so-called MAIN TABLE while some of the remainder, 88 to be precise, constitute a SUBSTITUTION TABLE.

Thus, whatever state the system is in, it is always possible to code 88 information words out of 256 in two alternative ways, or else employing one or other of two code words which are synonyms.

A suitable choice allows the coder an additional means of monitoring the low-frequency content of the signal.

In particular by choosing the coding of the MAIN TABLE, positive contributions will be obtained to the Digital Sum Value, whereas by choosing that of the SUBSTITUTION TABLE, negative contributions will be obtained.

The fact that the monitoring of the low frequency is managed only on a subset of words means that the system is obviously sensitive to "worst case" situations, a limitation which is however acceptable on account of the benefits offered in return.

The coding logic is thus prescribed on recognition of two parameters: input word (byte) and current machine state and on the realization of two functions h,g: the OUTPUT function, i.e. generation of the code word and the NEXT STATE function, i.e.:

code word generated=h (input word, current state)

next state=g (input word, current state) or else next state=g (input word, code word generated in the current state).

EFM-PLUS DECODING.

On account of the definition of the coding function:

code word=h (input word, current state), it is evident that, in the decoding phase it would be necessary to realize the inverse function, i.e. input word=1/h (code word, current state).

Therefore, the need to know the current state of the state machine in the coding phase is noted, this being possible, if one starts from a known initial state, but evidently negative, seeing that an error in the determination of the initial state could give rise to propagation thereof to the following determinations of the current state.

For this reason the coding function, or the choice of code words, is realized in a way whereby there is no need for the decoder to know the state of the coder.

Clearly if the code words exiting a state are chosen in such a way that they differ from those which exit from the other states, this condition is satisfied and each code word implicitly defines the state from which it is generated.

In practice this is possible only for the code words which lead to states 1 and 4 but not for the code words which lead to states 2 or 3, whose meaning, for the same code word, depends on the state which generated them, i.e. are ambiguous.

Nevertheless this ambiguity, which in practice reduces to a double meaning, is resolved by considering that these apparently identical code words differ since they always lead as next state to state 2, or 3.

If it is recalled that the words exiting state 2 and 3 differ since each word exiting state 2 has both its first and thirteenth bits at zero value, whereas the words exiting state 3 have at least one out of the first and thirteenth bits which does not have zero value, knowing these bits of the code word following that currently being decoded, makes it possible to correctly decode all the code words.

The decoding function may therefore be written succinctly as:

(source byte)=1/h (code word, next word).

In conclusion the EFM-PLUS system transforms the binary symbol on 8 bits into a 16-bit channel format, hence exhibiting an efficiency of 8:16.

EFM, EFM-PLUS COMPARISON.

The main differences between the two coding systems are evident from the above discussion.

1) EFM-PLUS allows an information density around 6% higher than that of EFM, 2) this is obtained in return for the need for a so-called LOOK AHEAD in the decoding phase.

Thus it is necessary to consider the following code word and in particular those bits ($1^{st}$ and $13^{th}$) which make it possible to recognize whether the state associated with the next word, i.e. the "next state" is state 2 or 3.

Whichever way it is said, examination of the bits of the word to be decoded allows one-to-one identification of the next states 1 and 4, without needing to consider any bit of the next code word.

3) EFM-PLUS, using a wider range of code words, with many synonyms, needs a much larger LOOK-UP TABLE in the decoding phase and essentially an associative memory with 1376 rows of 16+8 bits (16 comparison bits and 8 output code bits).

THE DECODING SYSTEM ACCORDING TO THE PRESENT INVENTION

After this lengthy preamble it is possible to consider the decoding system of the present invention which, through a suitable enumeration algorithm, valid both in the case of EFM and EFM-PLUS modulation, makes it possible to associate one of a practically continuous succession of numbers with each of the various code words, in a one-to-one manner.

By means of these numbers, with which is summed a displacement or "offset", depending on the next state (so as to resolve the ambiguities of the code words) and on the type of modulation (so as to allow the use of the same system to decode code words either with the EFM format or with the EFM-PLUS format) it is possible to address a transcoding ROM with far smaller dimensions than those required for the look-up tables required by the state of the art, and in particular with dimensions of 872 rows×8 bits.

Figure 3:
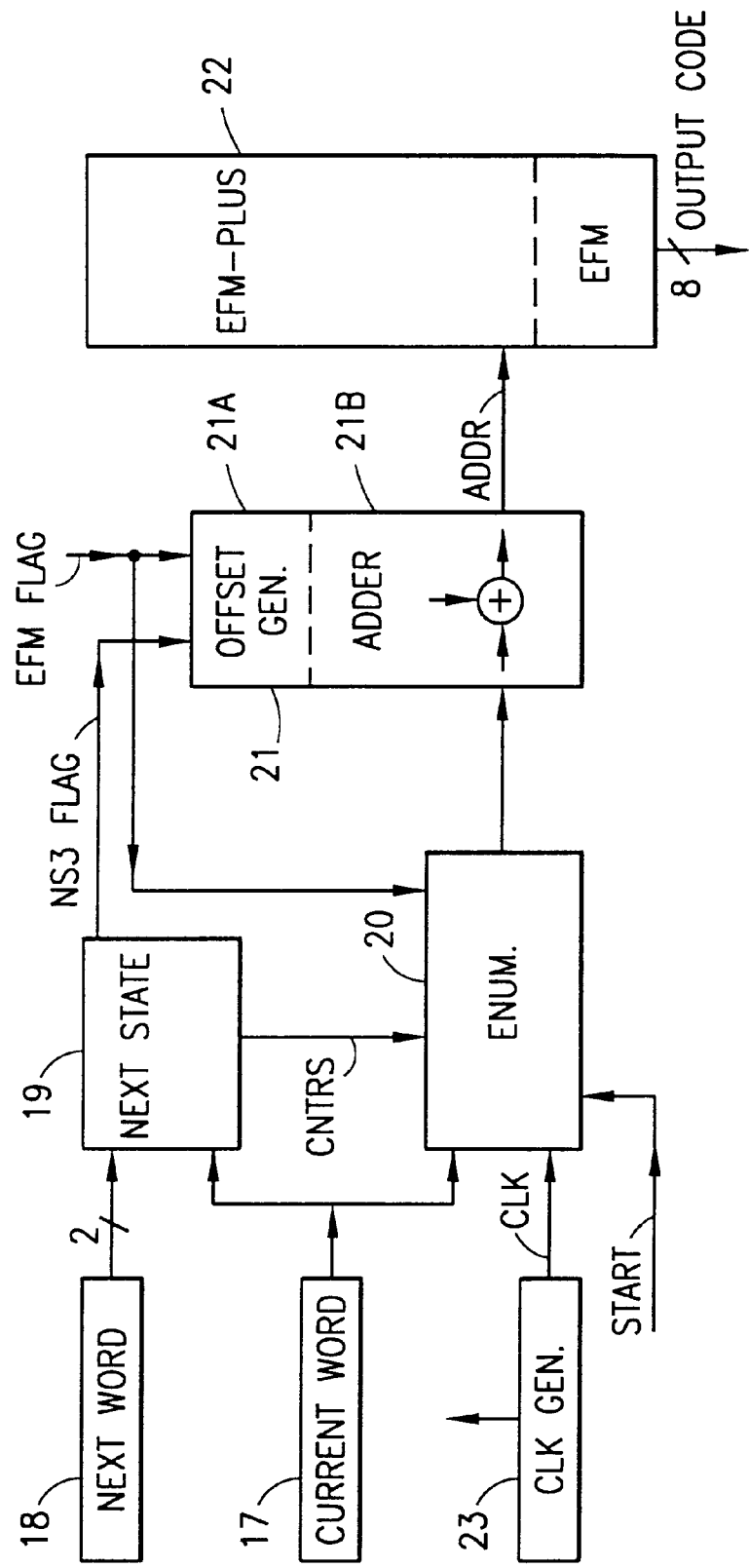
FIG. 3 is a block diagram of a preferred embodiment of a system for decoding code words in the EFM and EFM-PLUS format, in accordance with the present invention.

FIG. 3 represents a block diagram of the system which is the subject of the present invention, which consists basically of:

1) a pair of registers 17 (CURRENT WORD) and 18 (NEXT WORD) respectively for storing the current code word and the next code word.

2) A logic block 19 (NEXT STATE) connected to the registers 17 and 18 in order to receive from them the current code word and the $1^{st}$ and $13^{th}$ bits of the next word and to produce as output control signals CONTR.S and a flag signal NS3 FLAG.

3) A logic block 20 (ENUM), connected to the output of the register 17 in order to receive the current word, for the enumeration of the word received as input.

4) A block 21 for generating an address ADDR with which to access a ROM.

The block 21 receives the result of the enumeration from the block 20 and the signal NS3 FLAG from the block 19.

It furthermore receives from outside a signal EFM FLAG which when set indicates that the code words are modulated in EFM rather than in EFM-PLUS.

This signal is also input to the enumeration block for the reasons which will be seen later.

5) A ROM 22 addressed by the address ADDR output by the block 21, so as to output an 8-bit output code OUTPUT CODE.

6) A clock signal generator 23 (CLK GEN) for generating clock signals CLK, which control the loading of the registers 17, 18 and the operation of the enumerator block 20.

This generator can form part, rather than of the system, of more extensive logic for monitoring the optical disc reading unit, which among other things also delivers the signal EFM FLAG and a signal START for starting the block 20.

DETERMINATION OF THE NEXT STATE (BLOCK 19)

The determination of the next state requires as input the value of the word currently in the decoding phase and bits 1 and 13 of the next code word and is required only in the case of EFM-PLUS modulation, to resolve possible ambiguities.

Since these are limited to the sole case of code words which cause entry to state 2 and 3 (of the coder), the block 19 is a simple logic unit which recognizes whether the current word terminates with a number of zeros lying between a minimum of 2 and a maximum of 5.

If this condition holds, examination of bits 1 and 13 of the next code word makes it possible to recognize the next state as state 3 if at least one of bits 1 and 13 is at 1.

In this case the signal NS3 FLAG is set.

Expediently but not necessarily, for the reasons which will be seen, the block 19 can verify how many zeros terminate the current word to be decoded (from none to a maximum of 9) and sends this information, as a control code CONTR.S (obviously 4-bit), to the enumeration block.

This allows the enumeration operation to be made swifter by limiting it to just the bits of the code word which differ from the tail of zero bits, if there are any.

On the other hand, the signal EFM FLAG is applied as input to the enumeration block 20 to define the length of the code word which is to be decoded.

ENUMERATION BLOCK AND ENUMERATION ALGORITHM

Before considering the structure of the enumeration block and the algorithm executed thereby, it is appropriate to illustrate how it is possible to enumerate in a one-to-one and continuous manner a given set of words satisfying certain requirements, in particular the EFM and EFM-PLUS format code words for which the minimum runlength=2 requirement is to be satisfied. considering that it is necessary to enumerate 16- or 14-bit words, it is possible to construct a table TAB(J,K) with J rows and K columns, respectively numbered from 0 to 6 and from 0 to 16 in which to each pair of coordinates JK of the table is mapped the number of words N(J,K) subject to the condition RLL(2) consisting of K bits, J of which are at 1.

The table is illustrated in FIG. 4.

Although the table can be constructed by exhaustion methods, it is also possible to construct it more simply by an interactive method:

the number of words N(O,K) with no 1 bits and with a number K of bits is clearly 1 irrespective of K.

The number of words N(1,K) having a single 1 bit is clearly equal to K.

The number of words N(J,K) with J>1 and K≦3 is obviously 0, again on account of compliance with the condition RLL(2).

The rows with index J=0, J=1 and columns with index K=0, 1, 2, 3 are thus defined.

The number N(J,K) of words with K bits, J of which are at 1 is given by $$N(J,K)=N(J,K-1)+N(J-1,K-3) \qquad ((1))$$

which is obviously meaningful for K≧3 and J≧1.

Formula ((1)) is justified since the number of words with K bits comprises words terminating with 0 and words terminating with 1, i.e. $N(J,K)=N(J,K)_0+N(J,K)_1$.

Necessarily $N(J,K)_0=N(J,K-1)$ again on account of compliance with the condition RLL(2) and hence also $N(J,K)_1=N(J-1, K-3)$.

Hence, by applying formula (1) recursively, the table TAB(J,K) can be compiled and extended indefinitely.

For each word length K it is also possible to derive a vector which represents, starting from an initial value 0, the cumulative number of words of length K which have a number of 1 bits≦J with J increasing.

For example for K=14 the vector S(14)=(0, 1, 12, 81, 201, 271, 277) and for K=16 S(16)=(0, 1, 17, 108, 328, 538, 594).

By using the table TAB(J,K) and the vectors S(14), S(16), it is possible to enumerate in a one-to-one and continuous manner all the code words 14 and 16 bits long which satisfy the condition RLL(2).

The enumeration operation, without excluding the possibility of using different algorithms, is executed in particular with an algorithm which can be represented succinctly by the following formula:

$$N = \sum_{1}^{L(16,14)} T(j, k-1) * (bitk) + S(16, 14), J \qquad (2)$$

$$k, (j = 1, 2 \dots J)$$

where: N is the number assigned to the word,

L is the length of the word (14 or 16 bits)

T(j,k−1) is the numerical value associated, in the table TAB(J,K), with the coordinates with index j,k−1 where k increases from 1 to L and j, for each non-zero term in the summation incremented by 1 up to the number J of 1-valued bits of the code word, bitk is the 1 or 0 value of the successive bits of the word, considered starting from the initial bit, S(16,14)J is the numerical value associated with the index J of one or other of the vectors S(14) or S(16) depending on the length of the code word considered.

In practice, since the number of 1 bits in the word is at most 6 in the case of 16-bit words and 5 in the case of 14-bit words, the summation reduces to the sum of 5 or 6 terms from the table TAB(J,K) plus an additional displacement term derived from the vector S.

For example the number $$N=T(1,2)+T(2,5)+T(3,9)+T(4,13)+S(16) \qquad (4)$$

i.e.

$$N=2+3+10+35+108=158$$

is associated with the generic code word "0010010001000100".

It may readily be verified that the algorithm is valid, i.e. associates each code word of any length L one-to-one with a number N from a set of consecutive numbers.

The order with which the bits of the code word are considered can be chosen either starting from the initial bit or from the tail bit, but it is preferable to consider the various bits starting from the initial bit because, since the number of 0 bits with which the word terminates is known a priori, by means of the NEXT STATE block 19, the summation operation can be truncated once the last 1 bit of the word has been considered.

It is also possible to use enumeration algorithms which differ from that represented by equation 2 and are based on weights assigned to each of the 1 bits of the code word, depending on the ordinal position of the bit in the code word and on the number of 1 bits in the code word.

For example, supposing that each element of the vectors S(14,16), following the first, represents the cumulative total of the elements of a column of the table TAB(J,K), the addend S(16,14)J in equation (2) can be substituted by the summation of subsequent addends, consisting of the elements of table TAB(J,K) belonging to column K=14 or 16, as the case may be.

These subsequent addends can also merge as weights, row by row, with the numerical values of a modified table TAB(J,K), for which the enumeration operation reduces to the sum of as many weights as there are 1 bits in the code word.

Clearly, in this way several tables of weights are defined which depend on the length of the code word to be decoded.

The algorithm represented by equation (2) is therefore preferable since it allows the use of one and the same table to decode code words of different length.

However, if this requirement is not required, the alternative solution alluded to above may be suitable, since it allows a further simplification of the logic circuits needed to execute the operation.

Evidently the operation represented by the formula indicated above can be executed with logic machines of different type.

Figure 5:
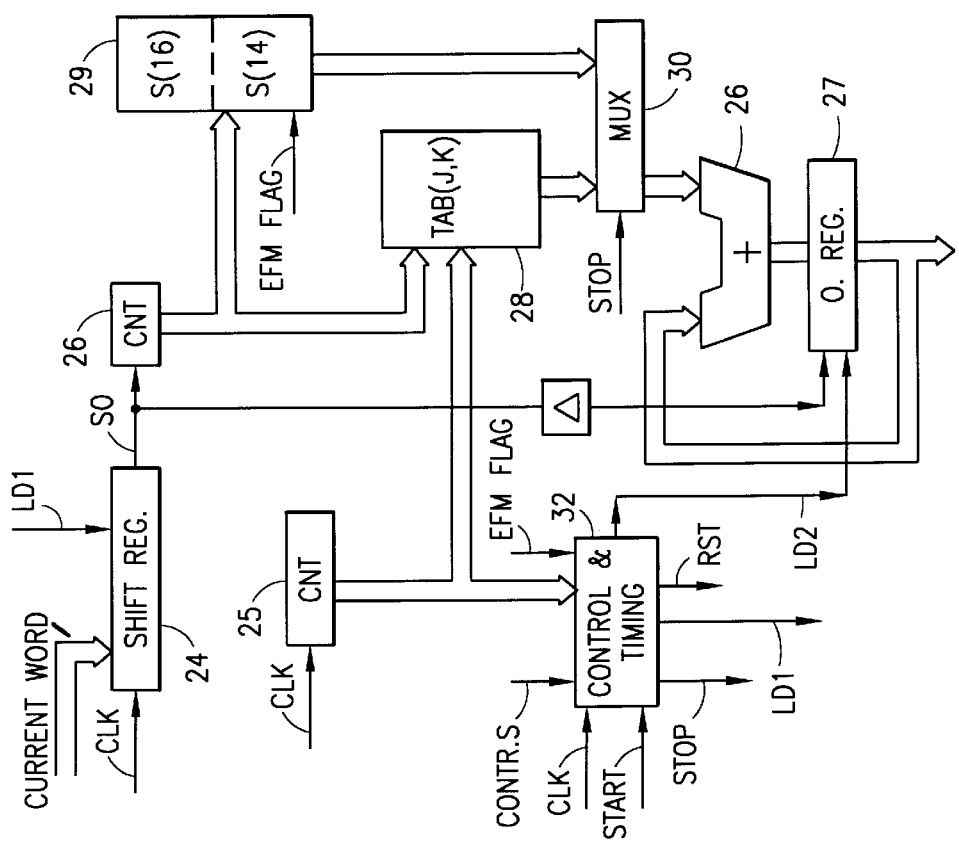
FIG. 5 represents a block diagram of a preferred embodiment of an enumerator block of the system of FIG. 3.

FIG. 5 represents a block diagram of a preferred embodiment of the enumeration block 20.

The enumeration block comprises a 16-bit shift register 24, a first 4-bit counter 25, a second 3-bit counter 126, a summator 26, an output register 27, a ROM memory 28 containing the table TAB(J,K), a second ROM memory 29 containing the vectors S(14) S(16), a multiplexer 30 and control and timing logic 32.

The ROM 29 is addressed by the code output by the counter 126 and by the signal EFM FLAG which selects one or other of two ROM areas where the vectors S(14) and S(16) respectively are stored.

The ROM 28 is addressed by the codes output by the counter 126 and by the counter 25.

The outputs of the ROMs 28 and 29 are connected to an input of the summator 26, across the multiplexer 30 controlled by a signal (for example STOP) generated by the timing and control unit.

The output of the summator 26 is connected to the input of the register 27, whose output, upon interposition of a second register (not illustrated) is connected to the second input of the summator.

The control and timing unit 32 receives the code output by the counter 25, the signal EFM FLAG, the code CONTR.S, the clock signal CLK and an external START command, and outputs timed signals STOP, RST, LD1, LD2, which have the function of freezing the state of the counter 25 and of the shift register 24, resetting the various registers and counters, and loading the registers 24 and 27.

The register 24, when enabled, transfers its content to its serial output SO with each pulse of CLK received.

The counter 25, when enabled, increments with each pulse CLK.

The block 20 operates as follows:

with the activation of the block, the various registers and counters are reset, then the register 24 is loaded in parallel with the code word (CURRENT WORD) to be decoded.

Following the enabling of the register and of the counter 25, the register transfers its content by one bit to the output SO with each pulse CLK and simultaneously the counter 25 increments.

When the word bit present at the output SO is 1 the counter 126 increments and with a suitable delay Δ, the value T(j,k−1) read from the memory 28, at the address defined by the counters 25, 126, is summed with the pre-existing content of the register 27, and loaded into the register 27.

When the counter 25 reaches a count value equal to 14 or 16 as defined by the signal EFM FLAG, the state of the register 24 and of the counter 25 becomes frozen.

In order to render the summation operation swifter there is provision to disable counting in the case of EFM-PLUS modulation, on recognition of the last bit=1 of the word, which is known by virtue of the code CONTR.S.

At this point the signal STOP instructs the multiplexer 30 to connect the output of the ROM 29 to the input of the summator 26 and the offset value extracted from the ROM 29 is summed with the pre-existing content of the register 27 and loaded into the same register by the command LD2.

The number contained in the register 27, associated by the enumerator with the word to be decoded, is input to the address generator 21 (FIG. 3) and, summed with a suitable offset value, constitutes the ROM address 22 at which is deposited on 8 bits, the symbol or byte corresponding to the decoded word.

ADDRESS GENERATOR

The address generator, which on account of its simplicity does not require a detailed embodying description, is divided logically into two parts: an OFFSET generator 21A and a summator 21B (FIG. 3).

The offset generator receives as input the signal NS3 FLAG (from the NEXT STATE block) and the signal EFM FLAG (from an external control unit).

These signals serve for the determination of the AREA of ROM 22 in which the decoding symbol is contained.

This arrangement overcomes the problem of the decoding of code words which are identical but correspond to different symbols and ensures the compatibility of decoding of both the EFM and EFM-PLUS formats (through the signal EFM FLAG).

Depending on the signals EFM FLAG and NS3 FLAG the OFFSET generator generates an area OFFSET which, summed with the displacement therein, delivered by the enumerator block, finally gives the ROM address to which to access.

Thus the summator 21B is a highly common summator which receives as input the numerical value contained in the register 27 and the OFFSET delivered by the generator 21A.

Bearing in mind, as deduced from the table TAB(J,K), that the total number of words with 16 and 14 bits respectively which satisfy the condition KL(2) is equal to 595, and 277 respectively, and likewise that the total number of words which have state 3 (and hence terminate with at least two zeros) as NEXT STATE is necessarily equal to 277, the ROM 28 can be limited dimensionally to 277+277+595= 1149 rows of 8 bits each.

Correspondingly by way of example, the OFFSETs generated by the generator 21A can have the following values:

0 to address a memory area of 277 rows wherein are contained the symbols corresponding to the EFM coding format, 277 to address a memory area of 595 rows wherein are contained the symbols corresponding to the EFM-PLUS coding format which have states 1, 2, 4 as next state and 872 to address a memory area of 277 rows, wherein are contained the symbols corresponding to the EFM-PLUS coding format which have state 3 as next state.

It is clear that the order in which the various areas are disposed and the corresponding addressing OFFSET can also be different.

The foregoing description relates to a decoding system capable of decoding code words both in the EFM-PLUS format and in the EFM format.

It is however evident that the system is operative also to decode code words in the EFM-PLUS format alone or in the EFM format alone, in which case simplifications are possible.

This implies a further reduction of the capacity of the ROM 22 to only 872 or 277 rows respectively and clearly also a reduction in the capacity of the ROM 29 (also of the ROM 28 in the case of EFM modulation) and a simplification of the control and timing unit 27.

The cost and the relatively low circuit complexity of the enumeration block (20) and of the address generator block 21 are largely compensated for, in all cases, by the smaller capacity required for the ROM 22, as against decoding systems which use associative memories, decoding logic arrays for comparing with templates or also underutilized conventional ROM memories.

It will be noted in regard to underuse, that the system described, associates a number from a continuous set of numbers one-to-one with the various code words which satisfy the minimum runlength condition RLL=2.

In the EFM and EFM-PLUS coding systems, the maximum runlength condition RLLMAX=10 is also complied with.

This implies that out of 277 and 277+595 words respectively, which the system is capable of decoding, 4 and respectively 6+6 code words are not in fact utilized, i.e. a percentage of the order of 1.5%, wholly negligible.

It would be possible to develop an enumeration system which also takes into account the maximum runlength condition, but the ensuing greater circuit complexity is not justified by the reduction in memory cells which is achieved.

FIG. 5 is purely by way of example of one out of the various possible embodiments of an enumerator block.

In conclusion there is described a method for demodulating code words in the EFM and/or EFM-PLUS format, and more generally code words which satisfy a minimum runlength condition, consisting in scanning the code word, in identifying the 1 bits of the word, and in associating with the code word, through an enumeration procedure, a numerical value from a continuous set of numerical values, the said numerical value being used with the addition of a possible OFFSET (necessary only in the case of EFM-PLUS decoding or alternative decoding of different formats, not necessarily the two formats specified above) to address a ROM memory wherein are contained the symbols associated with each of the various possible code words.

The enumeration procedure consists, in more detail, in associating with each of the 1 bits of the code word, these being recognized in an orderly fashion, a numerical weight derived from a table and depending on the position of the 1 bit in the code word and on the number of already recognized 1 bits of the code word, in executing the sum of the various weights thus associated and thus obtaining the numerical value to be associated with the code word.

Preferably the table of weights consists of weight elements which are independent of the length of the word to be decoded and the enumeration procedure comprises the further step of summing with the sum of the various weights an offset value dependent on the length and on the number of 1 bits of the word to be decoded.

There is also described a system which implements the method described.

While the invention has been particularly shown and described with reference to specific embodiments thereof, it will be understood by those skilled in the art that various changes in form and detail may be made thereto, and that other embodiments of the present invention beyond embodiments specifically described herein may be made or practice without departing from the spirit and scope of the present invention as limited solely by the appended claims.

What is claimed is:

1. A system for decoding code words which each comply with a minimum runlength condition in accordance with at least one of EFM and EFM-PLUS coded formats and each represent a binary information code associated with said code word, comprising:

an enumeration circuitry for associating in a one-to-one manner with each of the code words to be decoded a numerical value from a substantially continuous set of numerical values, and a read-only memory in which is stored, at each location addressable with one of the numerical values from said set, a binary information code associated with the code word in turn associated with the numerical value for addressing said location said read-only memory being equal to or smaller than 1149 rows of 8 bits.

2. The system according to claim 1, in which said code words are in the EFM-PLUS format and therefore some of said code words are ambiguous and associated with one of two different binary information codes, depending on the code word, immediately following the code word to be decoded further comprising:

means for recognizing a code word to be decoded and an immediately following code word so as to generate an offset signal, having a first and second level associated respectively with one of the two different binary information codes; and an address generator controlled by said offset signal and receiving as input said numerical value associated by said means of enumeration with said code word to be decoded, so as to produce as output an address of said read-only memory which is the sum of said numerical value associated by said means of enumeration with said code word to be decoded and of an offset which has a first and second numerical value respectively for said offset signal at said first and second level.

3. The system according to claim 2, in which said code words are either in the EFM-PLUS format or in the EFM format, in which said read-only memory comprises a first storage area for binary information codes associated with code words in the EFM-PLUS format and a second storage area for binary information codes associated with code words in the EFM format and in which said means of enumeration and said address generator receive as input a control signal so as to identify the code words to be decoded as formatted in the EFM format, said control signal compelling said means of enumeration to operate on only 14 bits, and said address generator to produce as output an address which is the sum of said numerical value associated with a code word to be decoded, in the EFM format, and of a third offset numerical value, with said address there being addressed a memory location in said second area.

4. The system according to claim 3, in which said means of enumeration, comprises a first table for storing weights to be associated with the 1 bits of said code words depending on the ordered position of the 1 bits and of the number of 1 bits in the code word to be decoded, irrespective of its format, a second table for storing offset weights to be associated with said code words, depending on their format and on the number of 1 bits of said code words, and means for summing said weights, associated with the 1 bits of said code word to be decoded and the said offset weight associated with the code word to be decoded and for outputting the sum of said weights as numerical value associated with said code word to be decoded.

5. The system according to claim 1, wherein said read-only memory is 872 rows of 8 bits when only EFM-PLUS decoding is being performed.

6. The system according to claim 1, wherein said read-only memory is 277 rows of 8 bits when only EFM decoding is being performed.

7. The system according to claim 1, wherein said system is for decoding either EFM-PLUS and EFM coded formats.

8. A method of decoding code words which each comply with a minimum runlength condition and each represent a binary information code associated with each code word, comprising the following steps:

associating in a one-to-one manner with a code word to be decoded a numerical value from a continuous set of numerical values; and addressing with said numerical value a read-only memory in which is stored, at each addressable location, a binary information code associated with the code word in turn associated with said numerical value, said read-only memory is limited to a maximum of 1149 rows of 8 bit of memory space.

9. The method of claim 5, wherein said method of decoding is for decoding either EFM-PLUS and EFM coded formats.

10. The method of claim 5, wherein said method of decoding is for decoding EFM-PLUS coded formats and wherein said read-only memory is 872 rows of 8 bit memory locations.

11. The method of claim 5, wherein said method of decoding is for decoding EFM coded formats and wherein said read-only memory is 277 rows of 8 bit memory locations.

12. A system for decoding code words which each comply with a minimum runlength condition in accordance with at least one of EFM and EFM-PLUS coded formats and each represent a binary information code associated with said code word, comprising:

an enumeration circuitry for associating in a one-to-one manner with each of the code words to be decoded a numerical value from a continuous set of numerical values, and a read-only memory in which is stored, at each location addressable with one of the numerical values from said set, a binary information code associated with the code word in turn associated with the numerical value for addressing said location.

* * * * *